United States Patent
Enomoto et al.

(10) Patent No.: US 8,927,930 B2
(45) Date of Patent: Jan. 6, 2015

(54) CHARGED PARTICLE DEVICE

(75) Inventors: Hirohisa Enomoto, Tokyo (JP); Wataru Suzuki, Tokyo (JP); Shinya Kitayama, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/232,816

(22) PCT Filed: May 31, 2012

(86) PCT No.: PCT/JP2012/064154
§ 371 (c)(1),
(2), (4) Date: Jan. 14, 2014

(87) PCT Pub. No.: WO2013/015019
PCT Pub. Date: Jan. 31, 2013

(65) Prior Publication Data
US 2014/0197331 A1  Jul. 17, 2014

(30) Foreign Application Priority Data

Jul. 25, 2011  (JP) ................. 2011-162368

(51) Int. Cl.
| H01J 37/20 | (2006.01) |
| H01J 37/16 | (2006.01) |
| H01J 37/09 | (2006.01) |

(52) U.S. Cl.
CPC .......... *H01J 37/16* (2013.01); *H01J 37/09* (2013.01); *H01J 37/20* (2013.01); *H01J 2237/0216* (2013.01); *H01J 2237/26* (2013.01)
USPC .......................................... 250/306; 310/311

(58) Field of Classification Search
CPC ... H01J 2237/0216; H01J 37/16; H01J 37/02; H01J 2237/26; H01J 37/20; F16F 15/1414; F16F 7/104

USPC ................... 250/306, 307, 310, 311, 440.11, 250/442.11, 492.1, 492.2, 491.1, 1, 492.21
See application file for complete search history.

(56) References Cited

U.S. PATENT DOCUMENTS

| 6,774,981 B1 | 8/2004 | Watson et al. |
| 6,969,854 B1 | 11/2005 | Essers et al. |
| 2003/0153391 A1* | 8/2003 | Kawakami ................... 464/180 |
| 2006/0077368 A1 | 4/2006 | Iwata et al. |
| 2012/0096941 A1* | 4/2012 | Yoneda ....................... 73/504.12 |

FOREIGN PATENT DOCUMENTS

| DE | 30 50 554 A1 | 9/1982 |
| JP | 8-320570 A | 12/1996 |

(Continued)

OTHER PUBLICATIONS

International Search Report issued in International Application No. PCT/JP2012/064154 dated Jul. 3, 2012.

(Continued)

*Primary Examiner* — Michael Logie
(74) *Attorney, Agent, or Firm* — McDermott Will & Emery LLP (57) ABSTRACT

A charged particle device includes a cylindrical column (102), a charged particle beam optical system disposed in the column; a sample stage (103) disposed on the column, and a support device (211, 212) supporting the column. The support device includes a simply supported structure that simply supports the column at a plurality of support points set along an axial line direction of the column. The support points for the column are disposed at positions corresponding to the positions of nodes of vibration of the column. In this way, the rigidity of the column can be increased without increasing the weight of the column itself, whereby vibrations acting on the column can be decreased.

17 Claims, 10 Drawing Sheets

(56) References Cited

FOREIGN PATENT DOCUMENTS

| | | | | |
|---|---|---|---|---|
| JP | 2001-093456 A | | 4/2001 | |
| JP | 2009289468 A | * | 12/2009 | ............. H01J 37/16 |
| SU | 1240973 A | * | 6/1986 | ............. F16F 7/104 |

OTHER PUBLICATIONS

German Office Action, w/ English translation thereof, issued in German Patent Application No. 11 2012 002 764.7 dated May 14, 2014.

* cited by examiner

Fig. 9A $\lambda_1 = 1.875$, $\lambda_2 = 4.694$, $\lambda_3 = 7.855$

Fig. 9B $\lambda_1 = 4.730$, $\lambda_2 = 7.853$, $\lambda_3 = 10.996$

Fig. 10

CHARGED PARTICLE DEVICE

RELATED APPLICATIONS

This application is the U.S. National Phase under 35 U.S.C. §371 of International Application No. PCT/JP2012/064154, filed on May 31, 2012, which in turn claims the benefit of Japanese Application No. 2011-162368, filed on Jul. 25, 2011, the disclosures of which Applications are incorporated by reference herein.

TECHNICAL FIELD

The present invention relates to a charged particle device, and particularly to a column support structure.

BACKGROUND ART

In a charged particle device such as a scanning electron microscope, a transmission electron microscope, a scanning transmission electron microscope, and a charged particle beam processing device, a charged particle beam optical system is housed in a column. When the column is subjected to external vibrations such as environmental sound or floor vibrations, the charged particle beam optical system may be affected, resulting in a relative displacement between the electron beam and a sample, for example. The relative displacement may cause fluctuations in an observed image, whereby the resolution of the observed image may be decreased. Because the resolution is extremely small, the resolution is affected by even a minute vibration.

The charged particle device is provided with a structure or device for preventing the transmission of external vibrations to the column. For example, in a known structure, a device main body is installed on an anti-vibration mount so as to decrease the vibration acting from the outside. In another known structure, the amount of device vibration is decreased by increasing the rigidity of the device itself.

Patent Document 1 describes a structure joining an upper-end portion and a bottom portion of the column by a support member. Patent Document 2 describes a structure such that the bottom portion of the column is reinforced to decrease the amount of device vibration due to external vibrations.

PRIOR ART DOCUMENTS

Patent Documents

Patent Document 1: JP Patent Publication (Kokai) No. 2001-93456 A
Patent Document 2: JP Patent Publication (Kokai) No. 8-320570 A (1996)

SUMMARY OF THE INVENTION

Problem to be Solved by the Invention

In recent years, the axial length of the column has been increasing due to increasingly more sophisticated functionality of the charged particle device. As the axial length of the column is increased, the eigen frequency is decreased, and resonance tends to be caused more easily. For example, when the axial length of the column is increased by 40%, the eigen frequency is approximately halved. In order to avoid a decrease in eigen frequency, the column needs to be reinforced. For example, the diameter of the column is increased by approximately twofold for column reinforcement. In this case, the weight of the column becomes 5.6 times greater than the original weight because of a weight increase due to the increase in axial length and a weight increase due to the increase in column diameter.

In order to reinforce the column, ribs may be installed at four corners of the column. In this case, the height of the ribs needs to be approximately 1.5 times the column diameter, resulting in a significant increase in the overall size of the structure. Further, the weight would be 1.8 times greater than the original weight.

An object of the present invention is to provide a charged particle device such that the rigidity of the column is increased without increasing the weight of the column, whereby vibrations acting on the column can be decreased.

Means for Solving the Problem

According to the present invention, a charged particle device includes a cylindrical column, a charged particle beam optical system disposed in the column, a sample stage disposed on the column, and a support device supporting the column.

According to the present invention, the support device includes a simply supported structure that simply supports the column at a plurality of support points set along an axial line direction of the column. The support points for the column are disposed at positions corresponding to the positions of nodes of vibration of a beam having free ends at both ends, the column being considered as the beam.

Effects of the Invention

According to the present invention, the rigidity of the column of a charged particle device is increased without increasing the weight of the column itself, whereby vibrations acting on the column can be decreased.

MODE OF CARRYING OUT THE INVENTION

Figure 1:
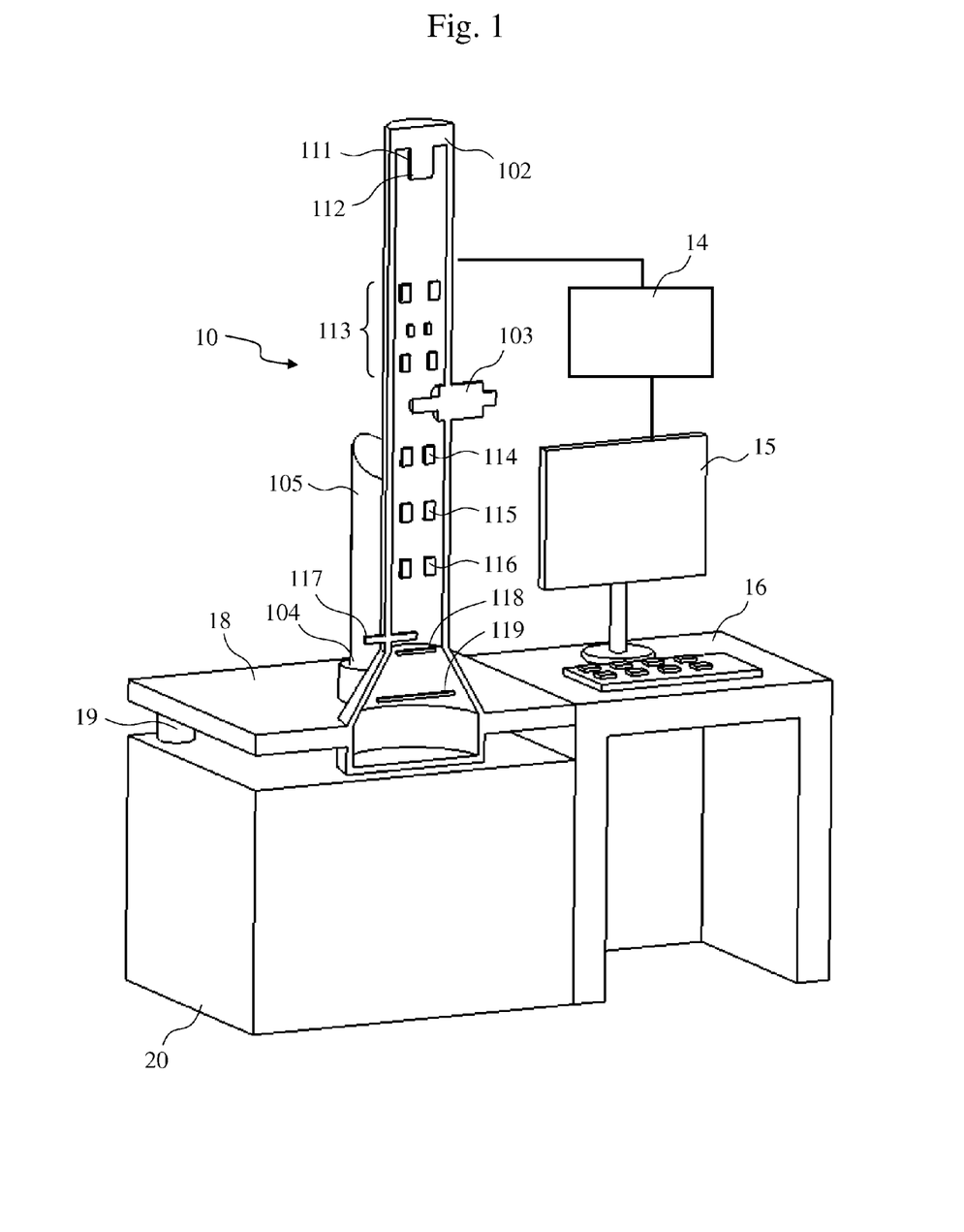
FIG. 1 is a diagram for explaining an example of the structure of a transmission electron microscope.

With reference to FIG. 1, the outline of a charged particle device will be described. The charged particle device may include a scanning electron microscope, a transmission electron microscope, a scanning transmission electron microscope, a charged particle beam (FIB) processing device, or the like. In the present example, the structure of a transmission electron microscope will be described. The transmission electron microscope is a device for conducting nanoscale observations.

The transmission electron microscope includes a main body 10, a load plate 18 supporting the main body 10, a mounting base 20 supporting the load plate 18, an anti-vibration mount 19 disposed between the load plate 18 and the mounting base 20, a control device 14, a display device 15, and an operating console 16.

The main body 10 includes a column 102. The column 102 is a cylindrical container and has an elongated structure extending along an optical axis direction. The column 102 is provided with an electron gun 111, an emitter 112, a condenser lens 113, an objective lens 114, an intermediate lens 115, a projection lens 116, a detector 117, a fluorescent screen 118, and a camera film 119.

On the side of the column 102, a sample stage 103, an ion pump 104, and an exhaust pipe 105 are disposed. A sample holder at the end of the sample stage 103 is configured to hold a sample as the object for observation. The sample holder is movable along horizontal and vertical directions and is also rotatable about an axial line of the sample stage 103, so that the sample can be inclined with respect to the horizontal plane. The ion pump 104 and the exhaust pipe 105 evacuate the inside of the column 102.

At the time of imaging by the transmission electron microscope, an electron beam generated by the emitter 112 of the electron gun 111 is focused by the condenser lens 113 to irradiate the sample at the end of the sample stage 103. The electron beam that has passed through the sample is enlarged by the objective lens 114, the intermediate lens 115, and the projection lens 116, detected by the detector 117, and then forms an image on the fluorescent screen 118 and the camera film 119. Through the above process, an observed image is obtained. The operating console 16 includes a control panel for operating the transmission electron microscope, and the display device 15 for displaying the observed image. The control device 14 sends an instruction from the operating console 16 to various elements of the transmission electron microscope.

In a conventional charged particle device, the column 102 is supported on the load plate 18. Namely, the column 102 is supported by the load plate 18 in a cantilever fashion. By providing the anti-vibration mount 19 between the load plate 18 and the mounting base 20, transmission of vibrations from the floor to the column 102 can be avoided.

Figure 2:
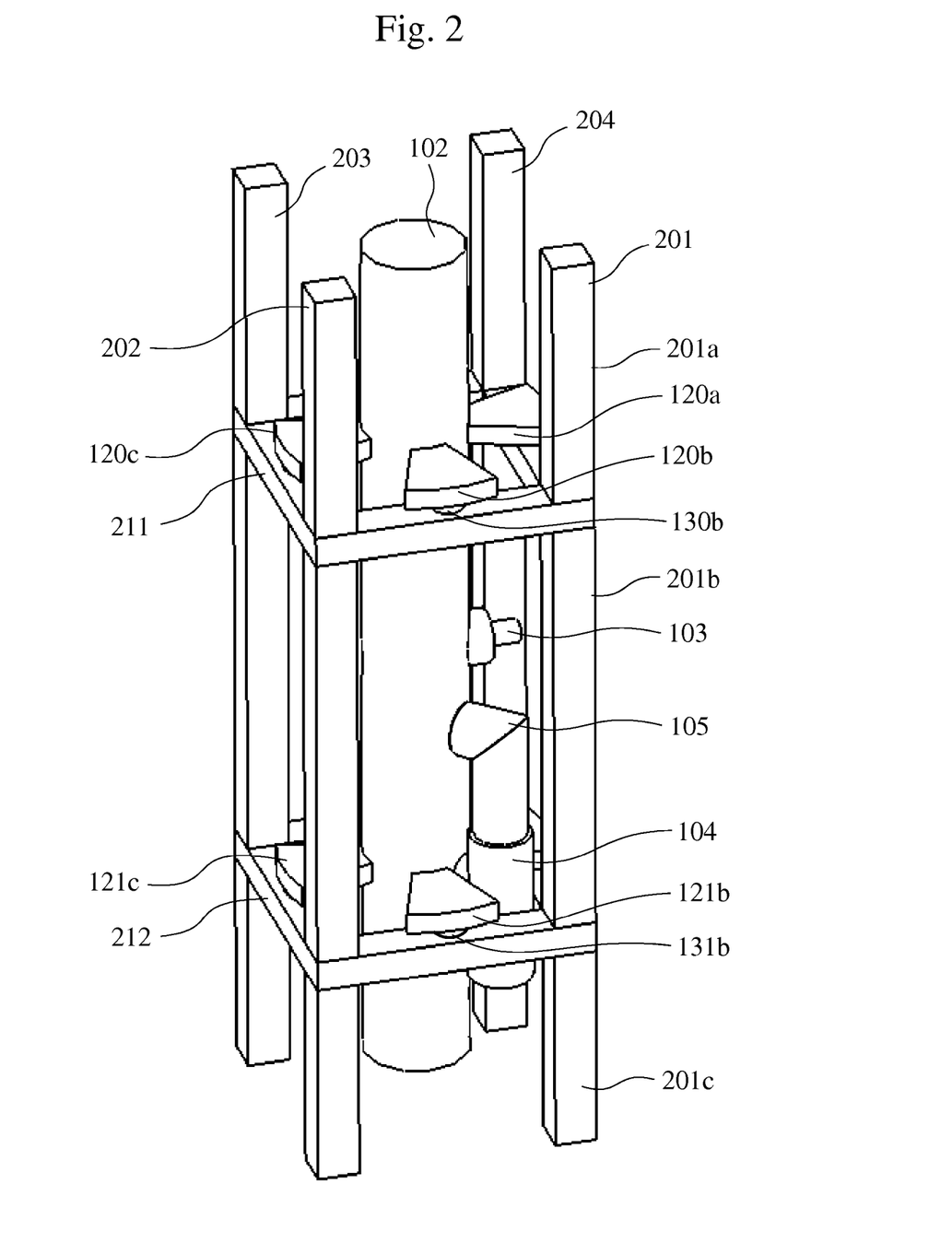
FIG. 2 is a diagram for explaining a first example of a support device for the column of the charged particle device according to the present invention.

With reference to FIG. 2, a first example of a support device for the column of the charged particle device according to the present invention will be described. The column 102 is a cylindrical structure with an extended axial length, with the sample stage 103, the ion pump 104, and the exhaust pipe 105 disposed on the side. On an outer peripheral surface of the column 102, upper projections 120a, 120b, 120c, and 120d, and lower projections 121a, 121b, 121c, and 121d are disposed. The position of these projections in the axial line direction will be described in detail below. The projections may have any shape as long as they have sufficient rigidity. While the projections are fan-shaped in the illustrated example, the projections may have a simple bar-like shape. While, in the present example, four projections are disposed on the outer peripheral surface of the column at regular intervals in the circumferential direction, the number of the projections may be one or any number.

The column 102 is supported by the support device. The support device includes four columnar members 201, 202, 203, and 204, and two support members 211 and 212 connecting the columnar members. The four columnar members 201, 202, 203, and 204 are disposed around the column 102 at regular intervals.

The columnar members 201, 202, 203, and 204 are disposed on the floor. The columnar members 201, 202, 203, and 204 are fixed on the floor by an appropriate method. For example, the columnar members 201, 202, 203, and 204 are fixed on the floor by anchor bolts. The columnar members 201, 202, 203, and 204 may have any structure as long as they have sufficient rigidity. The columnar members may have any cross sectional shape, such as circular or rectangular. The columnar members may be hollow, or solid for improved damping performance. The solid columnar members may be formed by filling hollow members with sand, concrete, or the like. The height of the columnar members 201, 202, 203, and 204 may be similar to, or greater than, the height of the column 102. The columnar members 201, 202, 203, and 204 may be provided with a fall-prevention structure or a fall-prevention function, both of which are not shown. For example, as the fall-prevention structure, an inclined frame member may be connected to the columnar members, or a support plate that widens toward the lower end may be fitted at the lower ends of the columnar members.

The support members 211 and 212 are respectively connected to the columnar members. The support members 211 and 212 are disposed in such a manner as to surround the column 102. The support members 211 and 212 may have any shape as long as they have sufficient rigidity. The support members 211 and 212 in the present example are rectangular frame members. The upper projections 120a, 120b, 120c, and 120d of the column 102 are supported by the upper support member 211. The lower projections 121a, 121b, 121c, and 121d of the column 102 are supported by the lower support member 212. The load of the main body including the column 102 is supported evenly by the upper support member 211 and the lower support member 212.

Between the upper projections 120a, 120b, 120c, and 120d of the column 102 and the upper support member 211, anti-vibration mounts 130a, 130b, 130c, and 130d are disposed. Between the lower projections 121a, 121b, 121c, and 121d of the column 102 and the lower support member 212, anti-vibration mounts 131a, 131b, 131c, and 131d are disposed. The anti-vibration mounts 130a to 130d, and 131a to 131d may have any structure as long as the structure functions to absorb and dampen vibrations. The vibration-proof mounts in the present example may have a structure such that a spring and a damper are connected in series or parallel.

The anti-vibration mounts 130a to 130d, and 131a to 131d include a mechanism for preventing the vibration of the column in the horizontal direction and vertical directions. Vibrations from the floor are transmitted to the support members 211 and 212 via the columnar members 201, 202, 203, and 204. However, the vibration of the support members 211 and 212 is attenuated by the anti-vibration mounts 130a, 130b, 130c, and 130d and prevented from being transmitted to the projections of the column. Sound waves in the air may be transmitted to the column, but the vibration of the column is attenuated by the anti-vibration mounts 130a, 130b, 130c, and 130d, and is, therefore, prevented from being transmitted to the support members 211 and 212 and the columnar members 201, 202, 203, and 204.

In the present example, each of the columnar members 201 includes an upper portion 201a, a central portion 201b, and a lower portion 201c. These three portions may be formed by separate members or by a single member. The upper support member 211 and the lower support member 212 may be formed by separate members from, or the same members as, the columnar members 201, 202, 203, and 204. For example, the lower support member 212 is connected on top of the lower portion 201c of the four columnar members 201; the central portion 201b of the four columnar members 201 is connected on top of the lower support member 212; the upper support member 211 is connected on top of the central portion 201b; and the upper portion 201a of the four columnar members 201 is connected on top of the upper support member 211.

Figure 3:
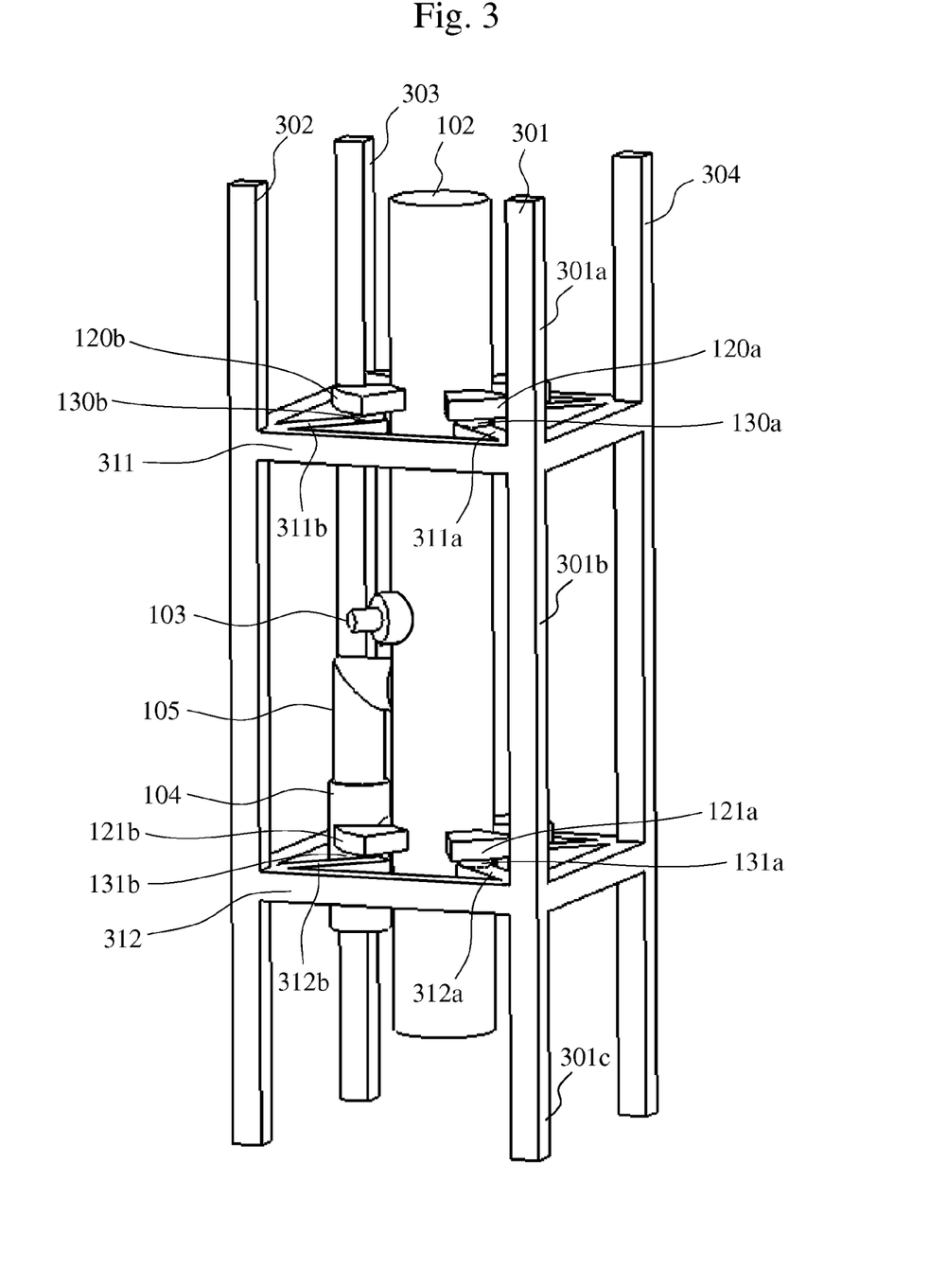
FIG. 3 is a diagram for explaining a second example of the support device for the column of the charged particle device according to the present invention.

With reference to FIG. 3, a second example of the support device for the column of the charged particle device according to the present invention will be described. The support device according to the present example includes four columnar members 301, 302, 303, and 304, and two support members 311 and 312 connecting the columnar members. The four columnar members 301, 302, 303, and 304 are disposed around the column 102 at regular intervals.

The support members 311 and 312 are respectively connected to the columnar members. The support members 311 and 312 are disposed in such a manner as to surround the column 102. The support members 311 and 312 according to the present example include rectangular frame members with inward projections extending inwardly of the frame members. The inward projections extend along the diagonal lines of the frame members. The upper projections 120a, 120b, 120c, and 120d of the column 102 are supported by inward projections 311a, 311b, 311c, and 311d of the upper support member 311. The lower projections 121a, 121b, 121c, and 121d of the column 102 are supported by inward projections 312a, 312b, 312c, and 312d of the lower support member 312. The load of the main body including the column 102 is evenly supported by the upper support member 311 and the lower support member 312.

Between the upper projections 120a, 120b, 120c, and 120d of the column 102 and the inward projections of the upper support member 311, the anti-vibration mounts 130a, 130b, 130c, and 130d are disposed. Between the lower projections 121a, 121b, 121c, and 121d of the column 102 and the inward projections of the lower support member 312, the anti-vibration mounts 131a, 131b, 131c, and 131d are disposed.

The support device according to the present example differs from the first example shown in FIG. 2 in the structure of the support members 311 and 312; in other respects, the present example may be similar to the first example.

In the present example, each of the columnar members 301 includes an upper portion 301a, a central portion 301b, and a lower portion 301c. These three portions may be formed by separate members or by a single member. The upper support member 311 and the lower support member 312 may be formed by separate members from, or the same members as, the columnar members 301, 302, 303, and 304. For example, the lower support member 312 is connected on top of the lower portion 301c of the four columnar members 301; the central portion 301b of the four columnar members 301 is connected on top of the lower support member 312; the upper support member 311 is connected on top of the central portion 301b; and the upper portion 301a of the four columnar members 301 is connected on top of the upper support member 311.

Figure 4:
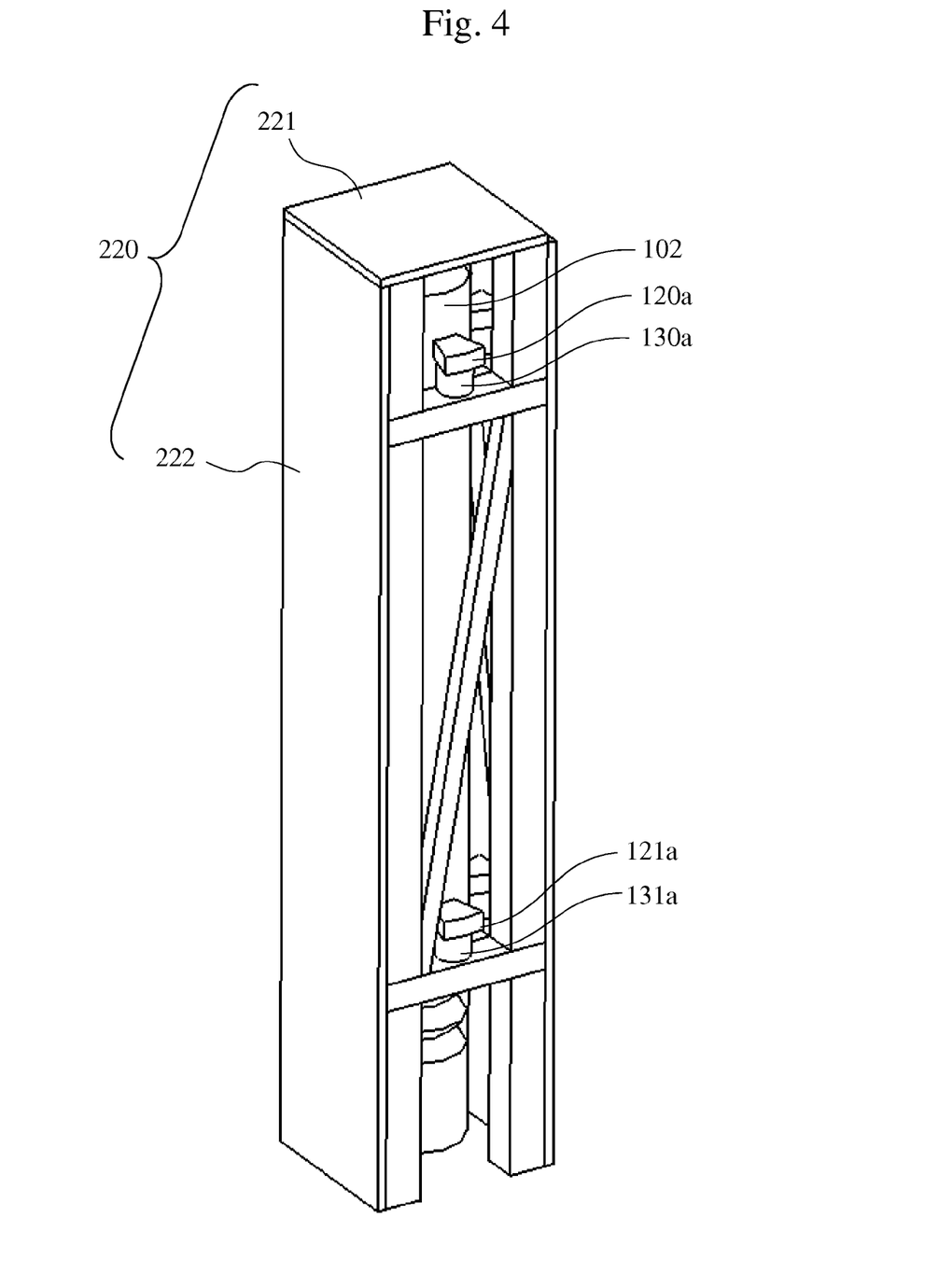
FIG. 4 is a diagram for explaining a third example of the support device for the column of the charged particle device according to the present invention.

With reference to FIG. 4, a third example of the support device for the column of the charged particle device according to the present invention will be described. The support device according to the present example includes a cover member 220. The support device according to the present example has the structure of the first example shown in FIG. 2 or the second example shown in FIG. 3 to which the cover member 220 is attached. Thus, while the support device according to the present example includes the four columnar members and the two support members connecting the columnar members, description of these members is omitted.

The cover member 220 includes a side cover 222 and a top cover 221. The cover member 220 is attached to the four columnar members such that the column 102 is entirely covered. One of the sides of the cover member 220 may be openable and closable. The cover member 220 may have a shape other than the shape as shown. For example, the cover member 220 is formed by a cylindrical container.

In the support device according to the present example, ambient acoustic vibrations can be prevented from directly acting on the column by the cover member 220. Thus, the sound pressure that acts on the column due to ambient acoustics can be decreased. In the support device according to the present example, the rigidity of the four columnar members can be increased by the cover member 220.

Figure 5A:
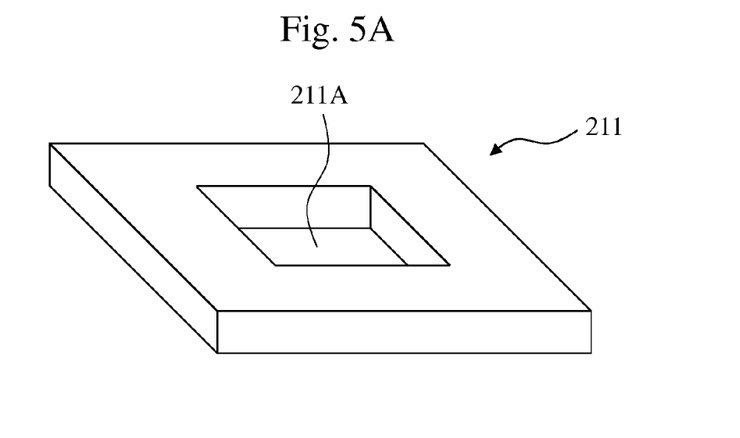
FIG. 5A is a diagram for explaining a first example of a support member of the support device for the column of the charged particle device according to the present invention.
Figure 5B:
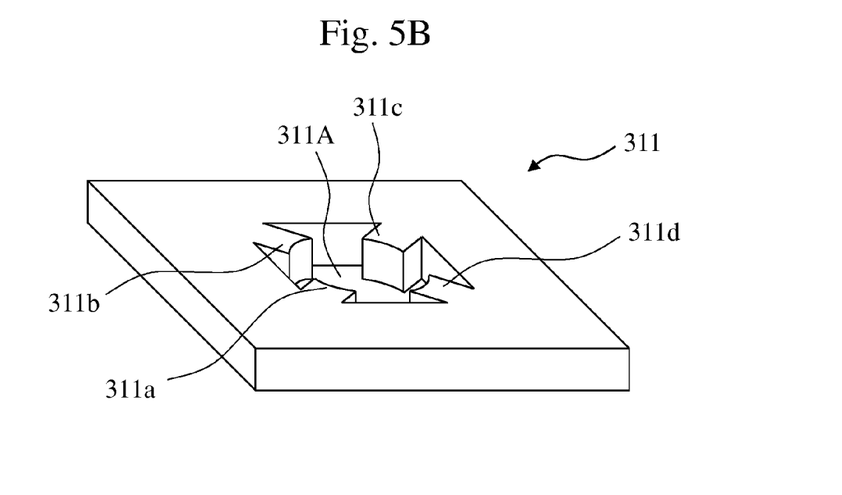
FIG. 5B is a diagram for explaining a second example of the support member of the support device for the column of the charged particle device according to the present invention.
Figure 5C:
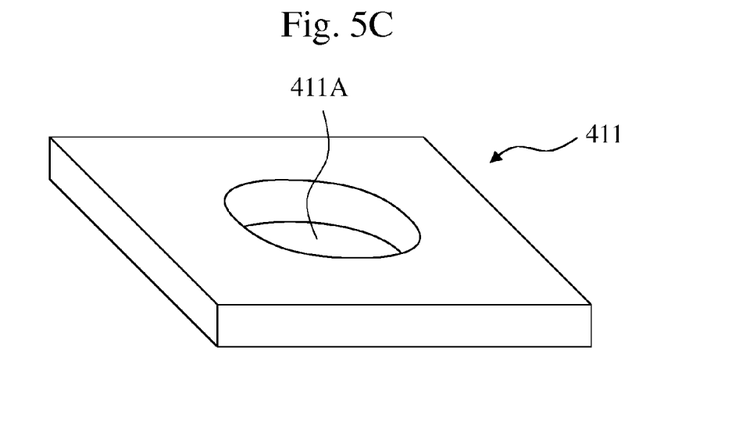
FIG. 5C is a diagram for explaining a third example of the support member of the support device for the column of the charged particle device according to the present invention.

With reference to FIGS. 5A, 5B, and 5C, examples of the support members of the support device for the column of the charged particle device according to the present invention will be described. The support member 211 shown in FIG. 5A is formed by a rectangular frame member with a rectangular opening 211A at the center. The opening 211A is penetrated by the column 102. The projections of the column 102 are supported by the frame member. The support member 211 of FIG. 5A is used in the first example shown in FIG. 2. The support member 311 shown in FIG. 5B is formed by a rectangular frame member with the inward projections 311a, 311b, 311c, and 311d extending inwardly, with a circular opening 311A formed at the center. The opening 311A is penetrated by the column 102. The projections of the column 102 are supported by the inward projections. The support member 311 of FIG. 5B is used in the second example shown in FIG. 3. The support member 411 shown in FIG. 5C is formed by a rectangular frame member with a circular opening 411A at the center. The opening 411A is penetrated by the column 1021. The projections of the column 102 are supported by the frame member.

Figure 6:
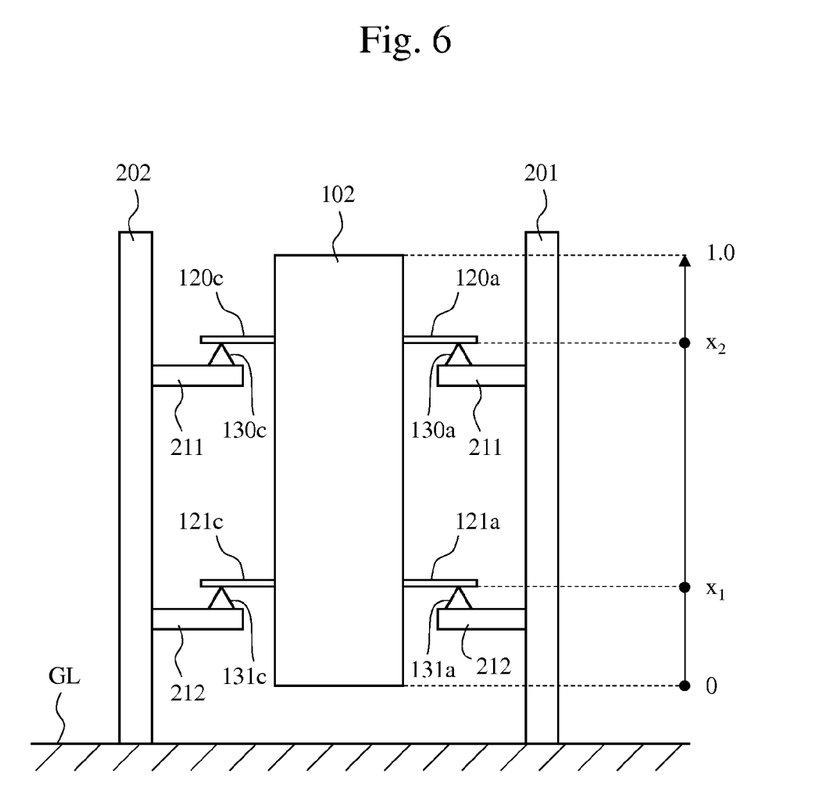
FIG. 6 is a diagram for explaining the position of column support points of the support device for the column of the charged particle device according to the present invention.

With reference to FIG. 6, the position of the projections of the column 102 of the charged particle device according to the present invention will be described. FIG. 6 is a schematic diagram of the column 102 and the support device in the charged particle device according to the present invention. The support device includes the columnar members 201 and 202, the upper support member 211, and the lower support member 212. The columnar members 201 and 202 are disposed on the floor. The upper projections 120a and 120c and the lower projections 121a and 121c are disposed on the outer periphery of the column 102. The upper projections 120a and 120c of the column 102 are supported by the upper support member 211 of the support device via the anti-vibration mounts 130a and 130c. The lower projections 121a and 121c of the column 102 are supported by the lower support member 212 of the support device via the anti-vibration mounts 131a and 131c.

As shown, a one-dimensional coordinate such that the lower end of the column 102 is at the origin (x=0) is set. The upper end of the column 102 has the coordinate x=1. The upper projections 120a and 120c and the lower projections 121a and 121c of the column 102 have the coordinates x=x2 and x=x1, respectively. According to the present invention, the position coordinates x1 and x2 of the projections correspond to the positions of nodes of a first order or second order mode of vibration when the ends of the column 102 are free ends. Namely, the projections 120a, 120c, 121a, and 121c are disposed at the positions of nodes of a first order or second order mode of vibration in a case where the ends of the column 102 are free ends, and the projections are supported by the support members of the support device. At the positions of nodes of vibration, the displacement of the column 102 is zero. By supporting the column 102 at the positions of nodes of vibration, no resonance is caused even when vibration of the floor is transmitted to the column 102. Further, according to the present invention, because the column 102 is supported by a simply supported structure, the eigen frequency is increased compared with the case of supporting the column 102 in a cantilever fashion, as in the conventional charged particle device, whereby resonance can be suppressed. This will be described in detail below.

Figure 7A:
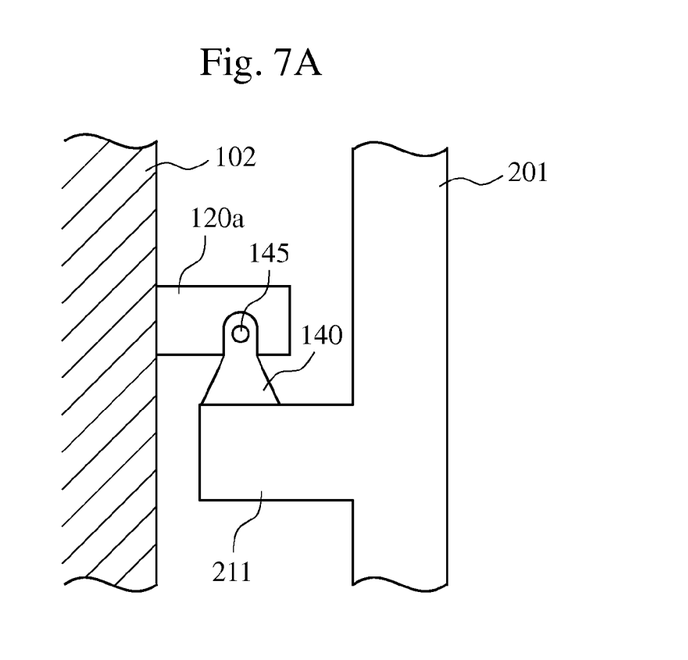
FIG. 7A is a diagram for explaining an example of the structure of the column support points of the support device for the column of the charged particle device according to the present invention.
Figure 7B:
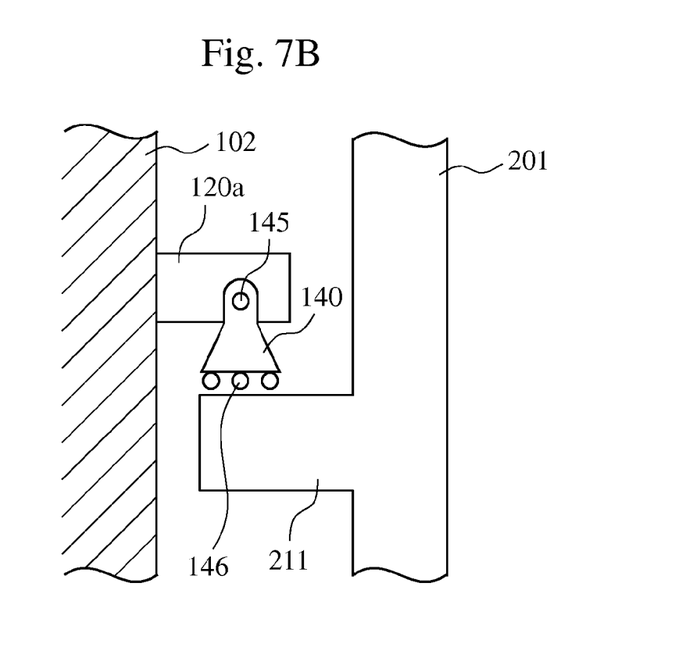
FIG. 7B is a diagram for explaining another example of the structure of the column support points of the support device for the column of the charged particle device according to the present invention.

With reference to FIGS. 7A and 7B, examples of the structure of the column support points according to the present invention will be described. While the support points of the upper projection 120a of the column 102 will be described, the structure of the support points of the lower projection 121a may be identical to the structure of the support points of the upper projections. According to the present invention, the column has the simply supported structure for providing simple support at the support points. The simply supported structure, as opposed to the cantilever supported structure, restricts the displacement of the beam at the support points and yet permits the beam to be tilted.

In the example shown in FIG. 7A, the simply supported structure is used. The simply supported structure is disposed between the projection 120a of the column 102 and the support member 211 of the support device. The simply supported structure includes a pin 145 disposed on the projection 120a of the column 102, and a support mount 140 rotatable about the pin 145. The support mount 140 is fixed on the support member 211.

The simply supported structure permits the rotational displacement of the projection 120a of the column 102 about the pin 145, and yet does not permit the displacement of the projection 120a of the column 102 in the horizontal and vertical directions with respect to the support mount 140. Thus, the simply supported structure only permits tilting of the column 102 and prevents the displacement of the column 102 in the horizontal and vertical directions.

In the example shown in FIG. 7B, a roller support structure is used. The roller support structure is a type of the simply supported structure. The roller support structure is disposed between the projection 120a of the column 102 and the support member 211 of the support device. The roller support structure includes the pin 145 disposed on the projection 120a of the column 102, the support mount 140 rotatable about the pin 145, and a roller 146 disposed between the lower end portion of the support mount 140 and the support member 211.

The roller support structure permits the rotational displacement of the projection 120a of the column 102 about the pin 145 but does not permit the displacement of the projection 120a of the column 102 in the horizontal and vertical directions with respect to the support mount 140.

However, the support mount 140 is movable in the horizontal direction with respect to the support member 211 via the roller 146. Thus, the roller support structure permits the column 102 to be tilted and moved in the horizontal direction, while preventing the displacement of the column 102 in the vertical direction.

In the examples shown in FIGS. 7A and 7B, the anti-vibration mount 130a described above is not shown. The anti-vibration mount may be built in the support mount 140 or fitted to the support mount 140 in series.

Figure 8A:
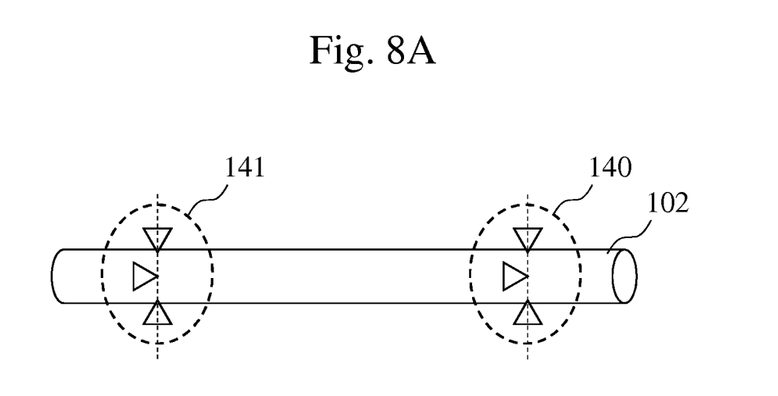
FIG. 8A is a diagram for explaining a first example of the column support points of the support device for the column of the charged particle device according to the present invention.
Figure 8B:
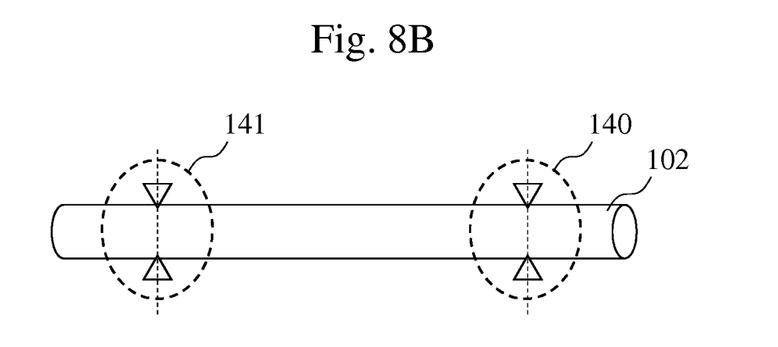
FIG. 8B is a diagram for explaining a second example of the column support points of the support device for the column of the charged particle device according to the present invention.
Figure 8C:
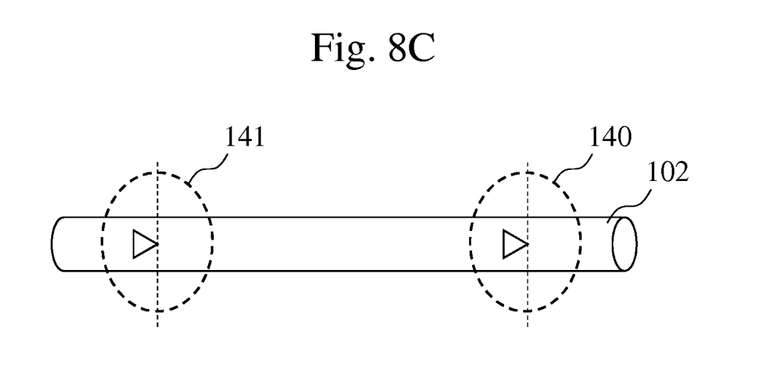
FIG. 8C is a diagram for explaining a third example of the column support points of the support device for the column of the charged particle device according to the present invention.

With reference to FIGS. 8A, 8B, and 8C, the support points of the column 102 according to the present invention will be described. In the example of FIG. 8A, the column 102 is supported at three points each at the upper portion and the lower portion of the support device. At each support point, three support mounts 140 or 141 are mounted. One of the three support mounts supports the column 102 along the axial line direction, while the other two supports the column 102 in a direction perpendicular to the axial line direction. In the example of FIG. 8B, the column 102 is supported at two points each at the upper and lower portions of the support device. At each support point, two support mounts 140 or 141 are mounted. These support mounts support the column 102 in a direction perpendicular to the axial line direction. In the example of FIG. 8C, the column 102 is supported at one point each at the upper and lower portions of the support device. At each support point, one support mount 140 or 141 is mounted. These support mounts support the column 102 along the axial line direction. When the column 102 is supported along the axial line direction, the column 102 may be supported from below, or suspended from above.

Figure 9A:
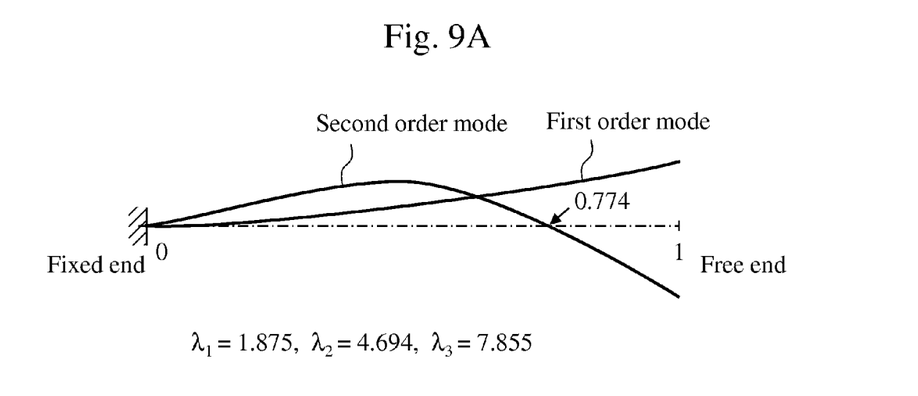
FIG. 9A is a diagram for explaining vibration modes of a cantilever supported structure for the column of a conventional charged particle device.
Figure 9B:
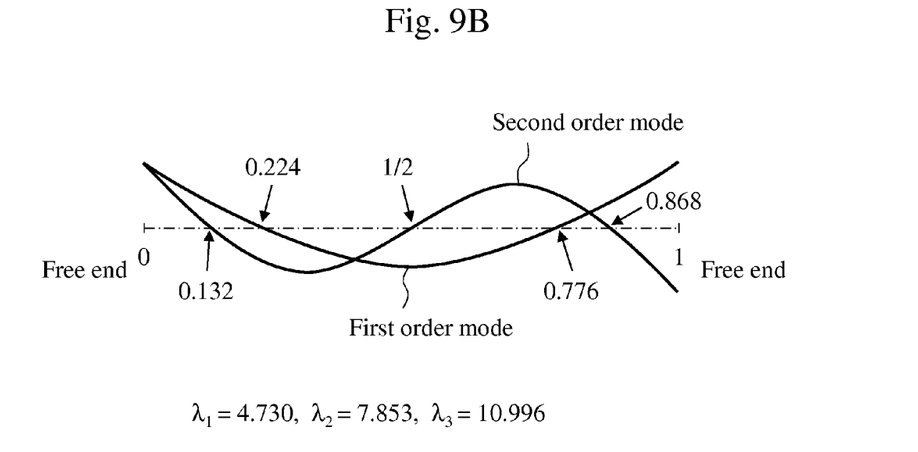
FIG. 9B is a diagram for explaining vibration modes of a simply supported structure for the column of the charged particle device according to the present invention.

With reference to FIGS. 9A and 9B, the column support structure of a conventional charged particle device and the column support structure according to the present invention are compared in terms of vibration mode and eigen frequency. Here, the column is considered to be a bar with uniform cross sectional area and material. When the bar vibrates horizontally with respect to the axis, this is referred to as a transverse vibration of the beam, and is expressed by a fourth-order differential equation. By using a boundary condition at both ends of the beam, the fourth-order differential equation can be solved, whereby a vibration curve is obtained. The vibration may be of a first order mode, a second order mode, or a third order mode, for example. The eigen frequency is expressed by expression (1).

[Expression 1]

$$f = \frac{\lambda^2}{2\pi l^2}\sqrt{\frac{EI}{\rho A}} \quad (1)$$

where E is the Young's modulus of the column, I is the moment of inertia of area of the column, ρ is the axial density of the column, A is the cross-sectional area of the column, and l is the length of the column. λ is a coefficient determined by the beam support method and the order of vibration. The moment of inertia of area I of the column is expressed by expression (2).

[Expression 2]

$$I = \frac{\pi D^4}{64} \quad (2)$$

FIG. 9A shows vibration modes of a cantilever supported beam. In the conventional charged particle device, the column is supported on the load plate. Thus, the column may be approximated by a cantilever supported beam. A one-dimensional coordinate such that a fixed end is at the origin (x=0) and a free end is at x=1 is set. Using boundary conditions that the displacement and slope at the fixed end (x=0) are zero, and that the moment and shear force at the free end (x=1) are zero, solving the fourth-order differential equation yields vibration curves shown. In the first order mode, the maximum amplitude appears at the free end of the beam. In the second order mode, a node (displacement is zero) appears at the point of x=0.774, and a large amplitude appears at the free end.

When the coefficient λ of expression (1) in the case of the cantilever supported structure shown in FIG. 9A is determined, $\lambda_{c1}$=1.875 in the first order mode of vibration, and $\lambda_{c2}$=4.694 in the second order mode. Substituting these values into λ of expression (1), we get the eigen frequency of the cantilever supported beam.

FIG. 9B shows vibration modes of a beam with free ends at both ends. A one-dimensional coordinate such that the free end on the left is at the origin (x=0) and the free end on the right is at x=1 is set. Using a boundary condition that the moment and shear force at the free ends (x=0, 1) are zero, solving the fourth-order differential equation yields the vibration curves as shown. In the first order mode, the maximum amplitude appears at the central portion of the beam and at the free ends at both ends. Nodes (displacement is zero) appear at the points x=0.224 and x=0.776. In the second order mode, nodes appear at the points of x=0.132, x=0.500, and x=0.868. The amplitude is increased at the center of the nodes and at the free ends at both ends.

According to the present invention, the positions of the nodes when the column vibrates are set as the column support points. Thus, no resonance is caused even when the vibration of the floor is transmitted to the column 102.

When the coefficient λ of expression (1) in the case of the free ends at the ends shown in FIG. 9B is determined, $\lambda_{f1}$=4.73 when the vibration is in the first order mode and $\lambda_{f2}$=7.853 when in the second order mode. Substituting these values of λ into expression (1), we get the eigen frequency of the beam with free ends at both ends.

As shown in expression (1), the eigen frequency is proportional to the square of the coefficient λ. The eigen frequency in the case of the free ends at both ends shown in FIG. 8B is 6 times or greater than the eigen frequency in the case of the cantilever supported structure shown in FIG. 8A.

While not shown in the drawings, similar observations can be made for the support structure in which both ends are simply supported. A one-dimensional coordinate such that the simple support point on the left is at the origin (x=0) and the simple support point on the right is at x=1 is set. Using a boundary condition that the displacement and moment at the simple support points (x=0, 1) are zero, solving the fourth-order differential equation yields vibration curves of the beam. In the first order mode, the maximum amplitude appears at the central portion of the beam. In this case, the ends of the column provide the support points. In the second order mode, a node appears at the central portion of the beam, and the maximum amplitude appears between the central node and the simple support points at both ends. In this case, the three points at the ends and the center of the column provide the support points.

In this case, when the coefficient λ of expression (1) is determined, when the vibration is in the first order mode, $\lambda_{s1}$=π, and in the second order mode, $\lambda_{s2}$=2π. Substituting these values of λ into expression (1), we get the eigen frequency of the beam with the simple supports at both ends. In this case, the eigen frequency is twice or greater than the eigen frequency in the case of the cantilever supported structure shown in FIG. 8A.

Further, similar observations can be made for the support structure with the simple support at the left end and a free end at the right end. A one-dimensional coordinate such that the simple support point on the left is at the origin (x=0) and the free end on the right is at x=1 is set. Using boundary conditions that the displacement and moment at the simple support point (x=0) are zero, and that the moment and shear force at the free end (x=1) are zero, solving the fourth-order differential equation yields the vibration curves of the beam. When the coefficient λ of expression (1) is determined, $\lambda_{fs1}$=3.927 when the vibration is in the first order mode and $\lambda_{fs2}$=7.069 when in the second order mode. Substituting these values of λ into expression (1), we get the eigen frequency of the beam with the simple support at one end and the free end at the other end. In this case, the eigen frequency is four times or greater than the eigen frequency in the case of the cantilever supported structure shown in FIG. 8A.

According to the present invention, the column support points are set at positions corresponding to the nodes of vibration of the beam with free ends at both ends. Alternatively, according to the present invention, the column support points may be set at positions corresponding to the nodes of vibration of the beam with the simple support at both ends. Further, the column support points may be set at positions corresponding to the nodes of vibration of the beam with the simple support at one end and a free end at the other end.

According to the present invention, the simply supported structure is used instead of the cantilever supported structure, whereby the eigen frequency of the column can be increased compared with the conventional charged particle device. Thus, resonance of the column can be prevented.

Further, according to the present invention, the column support points are set at the positions corresponding to the nodes of vibration of the beam, whereby resonance of the column can be avoided even when external vibration is transmitted to the column.

Figure 10:
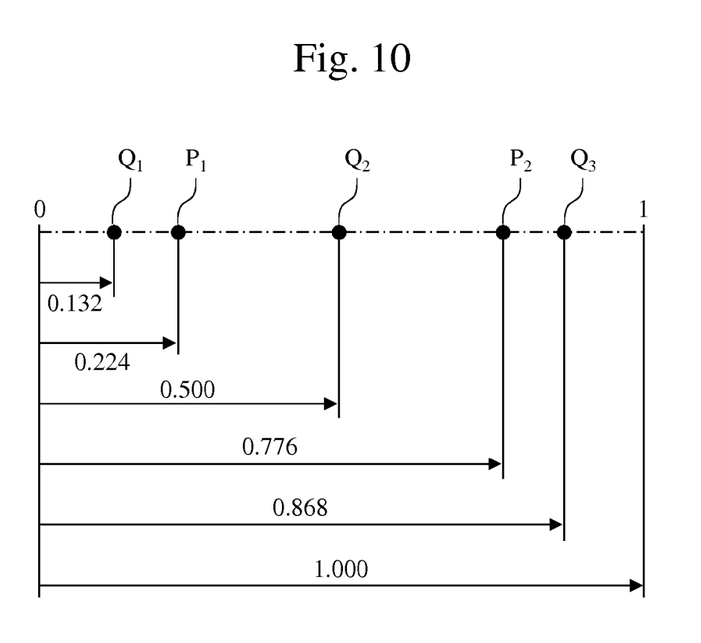
FIG. 10 is a diagram for explaining the position of support points of the simply supported structure for the column of the charged particle device according to the present invention.

With reference to FIG. 10, the positions of the column support points will be described. FIG. 10 shows a one-dimensional coordinate such that the lower end of the column is at the origin (x=0), and the coordinate at the upper end of the column is at x=1. Points P1 and P2 are the positions of the nodes of vibration in a case where the vibration of a beam with free ends at both ends is the first order mode. The coordinate of the point P1 is x=0.224, and the coordinate of the point P2 is x=0.776. Points Q1, Q2, and Q3 are the positions of the nodes of vibration in a case where the vibration of a beam with free ends at both ends is the second order mode. The coordinate of the point Q1 is x=0.132, the coordinate of point Q2 is x=0.500, and the coordinate of point Q3 is x=0.868.

In light of the first order mode of vibration, the points P1 and P2 may be determined as the column support points. In light of the second order mode of vibration, the points Q1, Q2, and Q3 may be determined as the column support points. Further, in light of both the first order mode and the second order mode of vibration, a first support point may be set between the points P1 and Q1, and a second support point may be set between the points P2 and Q3. The first support point may be disposed at the center of the points P1 and Q1, and the second support point may be disposed at the center of the points P2 and Q3.

According to the present invention, the column support points may be set at, or in the vicinity of, the positions of nodes of vibration. Even when the column support points are set in the vicinity of the positions of nodes of vibration, resonance of the column can be prevented.

According to the present invention, the rigidity of the column can be increased without increasing the weight of the column itself, and the vibration of the column itself or vibrations acting on the column can be decreased.

While examples of the present invention have been described, it will be readily appreciated by those skilled in the art that the present invention is not limited to the above examples, and that various modifications may be made within the scope of the invention defined in the claims.

REFERENCE SIGNS LIST 10 main body
14 control device
15 display device
16 operating console
18 load plate
19 anti-vibration mount
20 mounting base
102 column
103 sample stage
104 ion pump
105 exhaust pipe
111 electron gun
112 emitter
113 condenser lens
114 objective lens
115 intermediate lens
116 projection lens
117 detector
118 fluorescent screen
119 camera film
120a, 120b, 120c, 120d projection
121a, 121b, 121c, 121d projection
130a to 130d, 131a to 131d anti-vibration mount
140, 141 support mount
145 pin
146 roller
201, 202, 203, 204 columnar member
211, 212 support member
220 cover member
221 top cover
222 side cover
301, 302, 303, 304 columnar member
311, 312 support member
312a, 312b, 312c, 312d inward projection

The invention claimed is:

1. A charged particle device comprising:
   a cylindrical column;
   a charged particle beam optical system disposed in the column;
   a sample stage disposed on the column; and
   a support device supporting the column, wherein:
   the support device includes a simply supported structure simply supporting the column at a plurality of support points set along an axial line direction of the column, and
   when the positions of two nodes in the case of a first order mode of vibration of a beam having a free ends at both ends, the column being considered as the beam, are successive points P1 and P2, and the positions of three nodes in the case of a second order mode of vibration are successive points Q1, Q2, and Q3, the support points for the column are disposed at a first support point between the points P1 and Q1, and at a second support point between the points P2 and Q3.

2. The charged particle device according to claim 1, comprising projections on an outer periphery of the column at positions corresponding to the support points, wherein:
   the support device includes four columnar members disposed on a floor, and a support member connecting the columnar members; and
   the projections of the column are supported by the support member.

3. The charged particle device according to claim 2, comprising an anti-vibration mount between the projections of the column and the support member for supporting the column in a vibration-damping manner.

4. The charged particle device according to claim 2, wherein the support member includes a frame member having an opening penetrated by the column.

5. The charged particle device according to claim 1, wherein the support device is covered with a cover.

6. The charged particle device according to claim 1, wherein:
   the simply supported structure includes a pin disposed on the column, and a support mount rotatable about the pin; and
   the support mount is fixed on the support device.

7. The charged particle device according to claim 1, wherein the simply supported structure includes a roller support structure including a pin disposed on the column, a support mount rotatable about the pin, and a roller disposed between a lower end portion of the support mount and the support device.

8. A charged particle device comprising:
   a cylindrical column;
   a charged particle beam optical system disposed in the column;
   a sample stage disposed on the column; and
   a support device supporting the column, wherein:
   the support device includes a simply supported structure simply supporting the column at a plurality of support points set along an axial line direction of the column,
   the support points for the column are disposed at positions corresponding to the positions of nodes of vibration of a beam simply supported at both ends, the column being considered as the beam, the simply supported structure includes a pin disposed on the column and a support mount rotatable about the pin, and the support mount is fixed on the support device.

9. The charged particle device according to claim 8, comprising projections on an outer periphery of the column at positions corresponding to the support points, wherein:
the support device includes four columnar members disposed on a floor, and a support member connecting the columnar members; and
the projections of the column are supported by the support member.

10. The charged particle device according to claim 9, comprising an anti-vibration mount disposed between the projections of the column and the support member for supporting the column in a vibration-damping manner.

11. The charged particle device according to claim 8, wherein the support device is covered with a cover.

12. The charged particle device according to claim 8, wherein the simply supported structure includes a roller support structure having the pin, the support mount, and a roller disposed between a lower end portion of the support mount and the support device.

13. A charged particle device comprising:
a cylindrical column;
a charged particle beam optical system disposed in the column;
a sample stage disposed on the column; and
a support device supporting the column, wherein:
the support device includes a simply supported structure simply supporting the column at a plurality of support points set along an axial line direction of the column,
projections are disposed on an outer periphery of the column at positions corresponding to the support points,
the column is supported by the support device via the projections of the column, and
when the positions of two nodes in the case of a first order mode of vibration of a beam having a free ends at both ends, the column being considered as the beam, are successive points P1 and P2, and the positions of three nodes in the case of a second order mode of vibration are successive points Q1, Q2, and Q3, the support points for the column are disposed at a first support point between the points P1 and Q1, and at a second support point between the points P2 and Q3.

14. The charged particle device according to claim 13, wherein the support device includes four columnar members disposed on a floor, and a support member connecting the columnar members and supporting the projections of the column,
the charged particle device further comprising an anti-vibration mount disposed between the projections of the column and the support member for supporting the column in a vibration-damping manner.

15. The charged particle device according to claim 13, wherein:
the simply supported structure includes a pin disposed on the projections on the column, and a support mount rotatable about the pin; and
the support mount is fixed on the support device.

16. The charged particle device according to claim 13, wherein:
the simply supported structure includes a roller support structure having a pin disposed on the projections of the column, a support mount rotatable about the pin, and a roller disposed between a lower end portion of the support mount and the support device.

17. The charged particle device according to claim 13, wherein the support device is covered with a cover.

* * * * *